United States Patent [19]

An et al.

[11] Patent Number: 5,012,451

[45] Date of Patent: Apr. 30, 1991

[54] ROM CIRCUIT

[75] Inventors: Hyeong-keun An; Young-cheol Kim; Seok-jeong Lee, all of Seoul; Jung-jae Yu, Pusan, all of Rep. of Korea

[73] Assignee: Samsung Electronics Co., Ltd., Kyunggi-do, Rep. of Korea

[21] Appl. No.: 492,097

[22] Filed: Mar. 12, 1990

[30] Foreign Application Priority Data

Feb. 20, 1990 [KR] Rep. of Korea ............... 90-2072

[51] Int. Cl.[5] ............................................. G11C 13/00
[52] U.S. Cl. ............................... 365/230.05; 365/205; 365/189.08
[58] Field of Search ............... 365/103, 230.01, 189.01, 365/205, 230.06

[56] References Cited

U.S. PATENT DOCUMENTS 4,939,691 7/1990 Mizukami ....................... 365/189.01

*Primary Examiner*—Terrell W. Fears
*Attorney, Agent, or Firm*—Cushman, Darby & Cushman

[57] ABSTRACT

A ROM circuit is provided which can reduce the required area by simplifying a circuit construction. The ROM circuit generates N bit of data programmed at the respective cross section of output lines and word lines by decoding address signal. The ROM circuit comprises a decoder, a gate means, a memory cell array and a precharge means in which the decoder generates a word signal from an input address signal, the gate means supplied a word signal to a corresponding word line according to a clock signal, the memory cell array stores the desired data according to the combinational existence of MOS transistors at the respective cross section of the word line and the output lines, and the precharged means precharges the respective output lines according to the clock signal.

10 Claims, 3 Drawing Sheets

ROM CIRCUIT

FIELD OF THE INVENTION

The present invention relates to a Read Only Memory(ROM) circuit, and particular to a precharged ROM circuit which can reduce the required area by simplifying a circuit construction.

BACKGROUND OF THE INVENTION

A ROM, which is a read only memory device, is widely used in a variety of electric, electronic products.

Recently, with the progress of digital signal processing techniques, a demand of ROM has been increased and the development of semiconductor manufacturing techniques has enabled a circuit system for performing a specific function to be constructed by one chip.

For example, a Digital Audio Tape recorded (DAT), which can produce an excellent tone quality by processing an audio signal digital, comprises an only digital signal processor chip, namely, a DSP chip.

A DSP chip, which is a CMOS logic VLSI having a very large integration degree, includes several ROM, RAM and peripheral logic circuits within one chip. An existing ROM circuit built in a DSP chip by a static CMOS design has a problem that the size of a whole DSP chip comes to large due to the enlargement of the required area.

FIG. 1 is a circuit diagram of a 2×3 static ROM by a prior CMOS design method. In FIG. 1, a ROM circuit is largely devided into a decoder 1 and an encoder 2.

A decoder 1 generates the 4-bit word signal by decoding the 2-bit address signal $A_0$, $A_1$ inputted. A decoder 1 contains the four AND gates $G_1$ to $G_4$ and its output terminals are connected to the word lines $W_0$ to $W_3$ which, are driven according to the input states, respectively.

An encoder 2 consists of an AND circuit portion 3 made up a first conductive type, for example, P-channel MOS transistors and an OR circuit portion 4 made up a second conductive type, for example, N-channel MOS transistors.

An AND circuit portion 3 and an OR circuit portion 4 are connected to three output lines $D_0$ to $D_2$. At the cross section of the word lines $W_0$ to $W_3$ and the output lines $D_0$ to $D_2$, respectively, the OR circuit portion 4 is a region in which the desired data are memorized by being programmed according to the combinational existence of the N-channel MOS transistors in performing a manufacturing process.

A drain electorde of each of the N-channel MOS transistors is connected to an output line, a gate electrode is connected to the word line and a source electrode is connected to a first voltage supply power source (Vss or grounded voltage).

In the AND circuit portion 3, the P-channel MOS transistors (having the same number as the bit number of an address signal) are serially connected between each output line and a second voltage supply power source (VDD). The gate electrodes of the P-channel MOS transistors are respectively connected to word lines (for example, the word lines $W_1$, $W_2$). The output lines $D_0$ to $D_2$ are driven by these P-channel MOS transistors.

The output states corresponding to the address signals of the ROM circuit as described above are shown in the following Table 1.

TABLE 1

| $A_1$ | $A_0$ | $W_0$ | $W_1$ | $W_2$ | $W_3$ | $D_1$ | $D_2$ | $D_3$ |
|---|---|---|---|---|---|---|---|---|
| 0 | 0 | 1 | 0 | 0 | 0 | 1 | 0 | 0 |
| 0 | 1 | 0 | 1 | 0 | 0 | 0 | 1 | 0 |
| 1 | 0 | 0 | 0 | 1 | 0 | 0 | 1 | 1 |
| 1 | 1 | 0 | 0 | 0 | 1 | 1 | 0 | 1 |

Therefore, the ROM circuit of the prior CMOS design method as described above should simultaneously possess the P-channel MOS transistors corresponding to the N-channel MOS transistors.

Moreover, because a mobility of carriers in the P-channel MOS transistor is slow compared with the N-channel MOS transistor, the P-channel MOS transistor occupied a still more large area due to the relatively wide channel width.

Also, because a wiring region is required in order to connect the word lines corresponding to the AND circuit portion 3 comprising P-channel MOS transistors, the area of a wiring region comes to be large in porportion as a memory capacitance becomes large.

SUMMARY OF THE INVENTION

It is an object of the present invention to provide a ROM circuit with a simplified circuit construction.

It is another object of the present invention to provide a ROM circuit being able to attempt a high value added and high dignity of a DSP chip used in a DAT.

In achieving these and other objects of the invention, the ROM circuit which generates N bit of data programmed at the respective cross section of th word lines of $L(=2^M)$ number by decoding the M-bit address signal, and the output lines of N numbers (N: the natural number) comprises a decoder for generating an L bit word signal by inputting the M-bit address signal;

a gate means for supplying the L bit word signal with the word line of L number according to the clock signal;

A memory cell array recording the desired data according to the combinational existence of MOS transistor at the respective cross section of the word lines of L numbers and the output lines of N numbers; and a precharged means for precharging the respective output lines of N numbers according to the clock signal.

Here, a precharged means is characterized by precharging each output line through one P-channel MOS transistor according to a clock signal.

A ROM circuit according to the the present invention described simplifies the circuit construction of the AND circuit portion and reduces the area occupied by the ROM circuit due to the reduction of a wiring region.

BRIEF DESCRIPTION OF THE DRAWINGS

The above objects and other advantage of the present invention will become more apparent by describing the preferred embodiment of the present invention with reference to the attached drawing in which.

DETAILED DESCRIPTION

Figure 1:
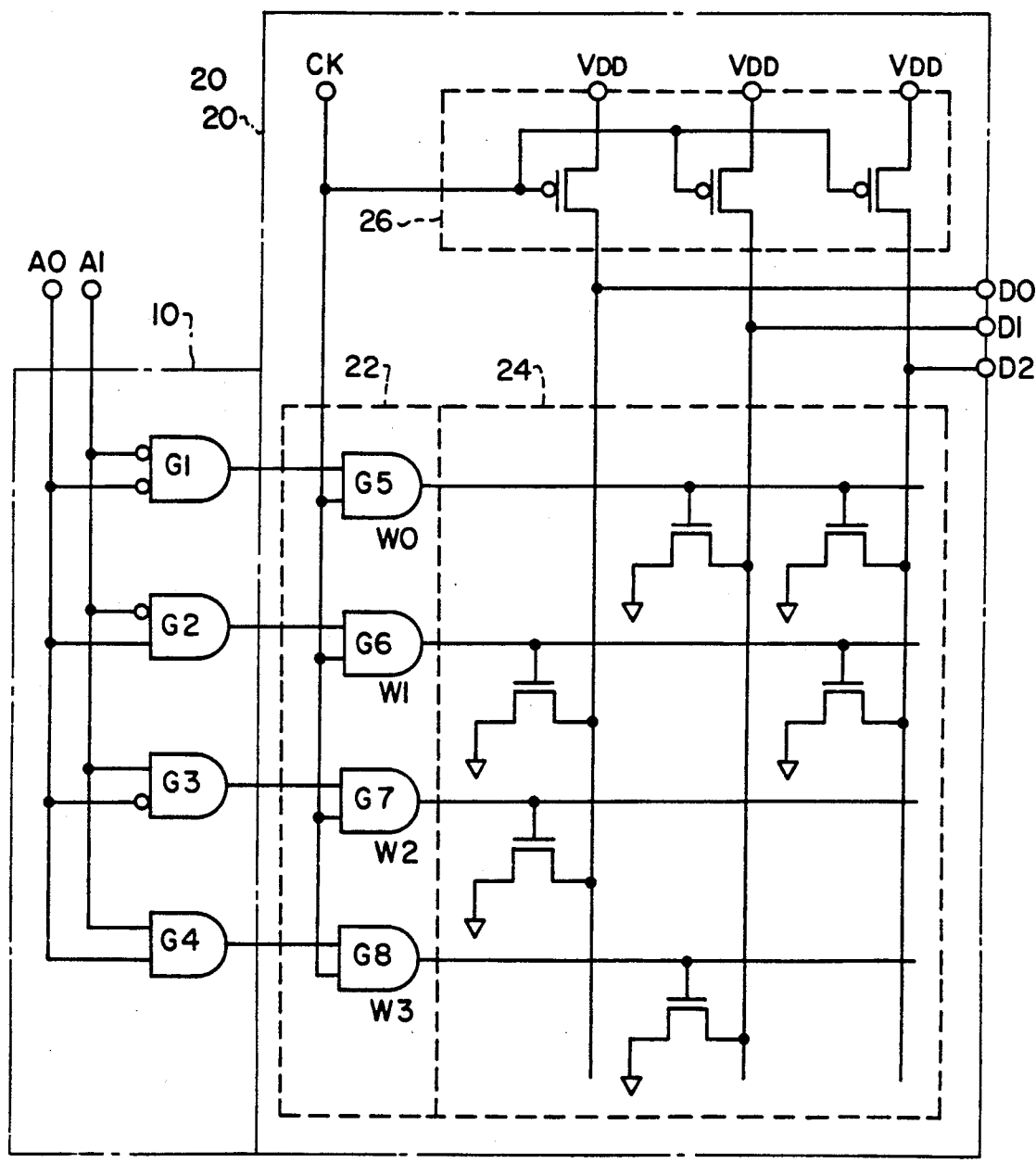
FIG. 1 is a circuit diagram of a 2×3 static ROM by a prior CMOS design method.
Figure 2:
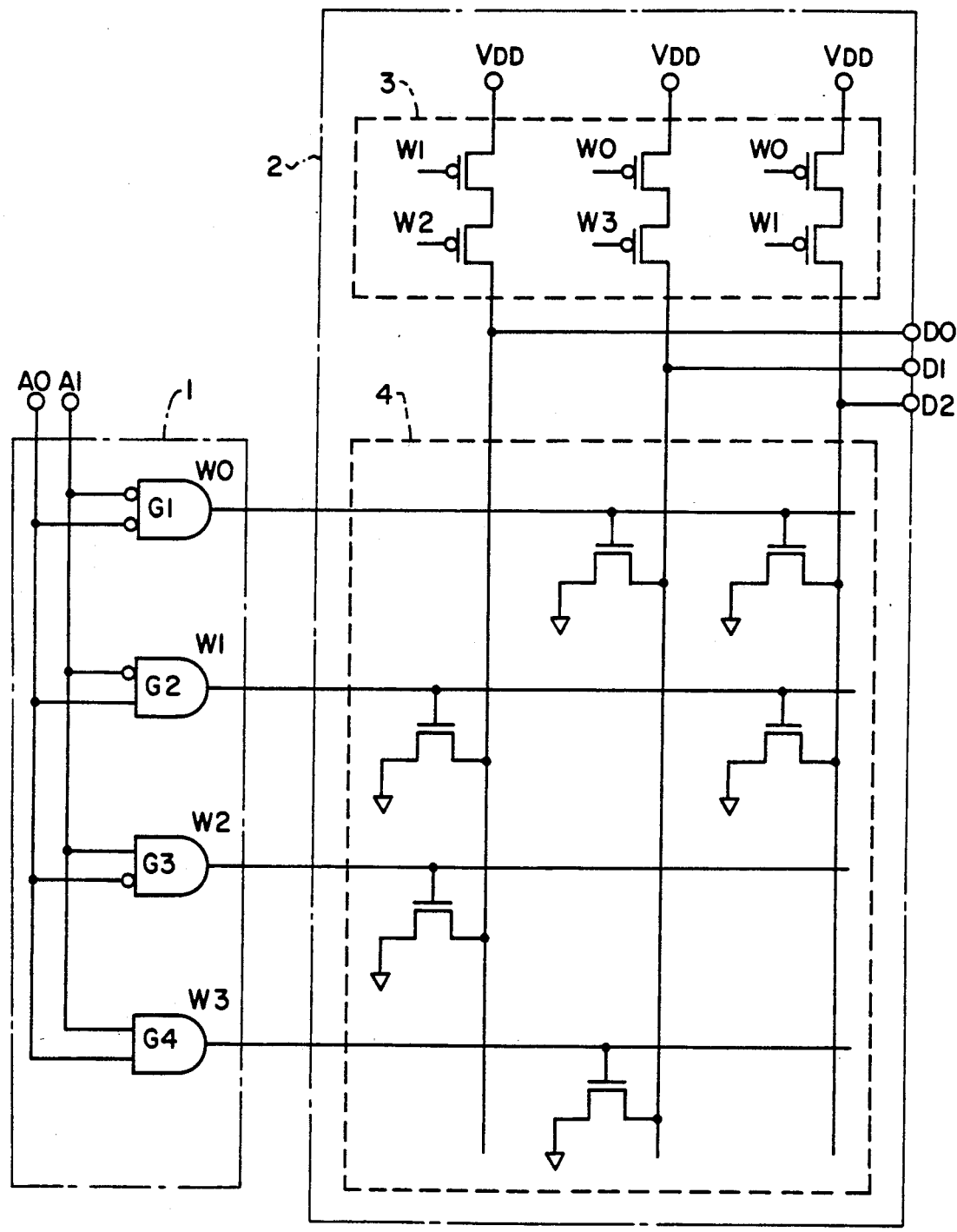
FIG. 2 is a circuit diagram of a 2×3 precharged AND ROM showing the preferable embodiment of the present invention.

FIG. 2 is a circuit diagram of a 2×3 precharged AND ROM according to the present invention. In FIG. 2, the construction of a decoder 10 and a memory cell array or an OR circuit portion 24 is same to that of a decoder 1 and an OR circuit portion 4 of the above-mentioned FIG. 1. The respective output lines of the decoder 10 are connected to the respective word lines $W_0$ to $W_3$ through a gate means 22.

This gate means 22 is composed of four AND gates $G_5$ to $G_8$. A clock signal(CK) is applied to one of input terminals and each AND gate $G_5$ to $G_8$ and the output terminals of the four AND gates $G_1$ to $G_4$ (i.e., the decoder 10) are connected to respectively the other of the input terminals of each AND gate to $G_5$ to $G_8$.

These AND gates $G_5$ to $G_8$ supply respective output signals of the decoder 10 to the corresponding word lines $W_0$ to $W_3$ when the clock signal (CK) is high.

Also, the respective output lines $D_0$ to $D_2$ are connected to a second voltage supply power source(VDD) through a precharged means 26. This precharged means is composed of P-channel MOS transistors in which a source electrode is connected to a second voltage supply power source (VDD), a drain electrode is connected to the corresponding output line, and a gate electrode is connected to receive a clock signal(CK) in order to supply a second voltage supply power source(VDD) with the output lines during the low level period of the clock signal (CK).

The output states corresponding to the inputs of the embodiment by the present invention as described above are shown in the following Table 2.

TABLE 2

| | | ck = 1 | | | | | | | ck = 0 | | |
|---|---|---|---|---|---|---|---|---|---|---|---|
| $A_1$ | $A_0$ | $W_0$ | $W_1$ | $W_2$ | $W_3$ | $D_0$ | $D_1$ | $D_2$ | $D_0$ | $D_1$ | $D_2$ |
| 0 | 0 | 1 | 0 | 0 | 0 | 1 | 0 | 0 | 1 | 1 | 1 |
| 0 | 1 | 0 | 1 | 0 | 0 | 0 | 1 | 0 | 1 | 1 | 1 |
| 1 | 0 | 0 | 0 | 1 | 0 | 0 | 0 | 1 | 1 | 1 | 1 |
| 1 | 1 | 0 | 0 | 0 | 1 | 1 | 0 | 1 | 1 | 1 | 1 |

For example, considering a circuit operation by assuming that the address signals $A_0$, $A_1$ are 00, the only output of an AND gate $G_1$ of a decoder 10 becomes "1" state and the outputs of the rest AND gates $G_2$ to $G_4$ become "0" states.

On the other hand, when the clock signal(CK) is "1" state, the P-channel MOS transistors of a precharged means 26 turn on and the current flow into output lines $D_0$ to $D_2$, and therefore, they are precharged as "1" state, respectively.

When the clock signal (CK) is converted from "0" state into "1" state, the P-channel MOS transistors of a precharged means 26 turn off and all signals supplied with two input lines of a AND gate $G_5$ are "1" state, and therefore, the N-channel MOS transistors of a memory cell array or an OR circuit part 24 connected to a word line $W_0$ of which the output line is "1" state turn on.

A first voltage supply power source (VSS or grounded Voltage) is applied to the output lines $D_1$, $D_2$ connected to the N-channel MOS transistors, so that they are "0" state and the output line $D_0$ continue to be the precharged "1" state. Therefore the output state becomes "100".

Figure 3:
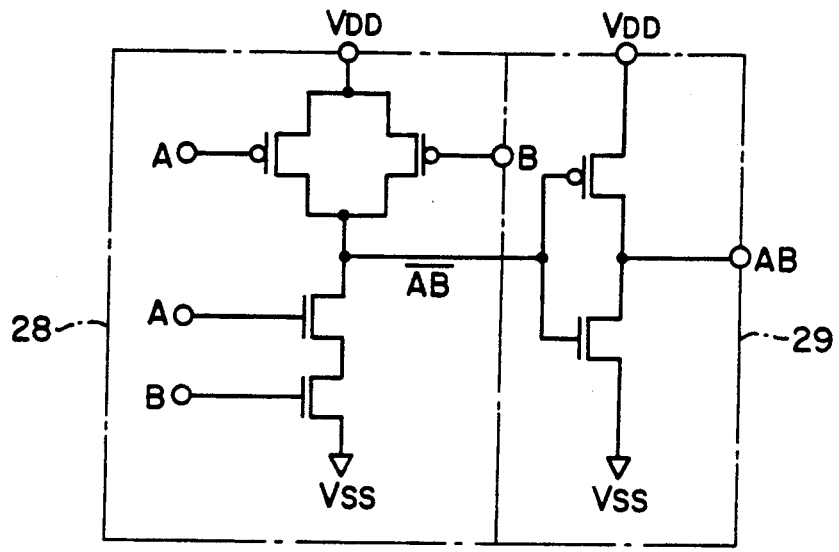
FIG. 3 is a detailed circuit diagram of a AND gate adopted into the gate means of FIG. 2.

As shown in FIG. 3, the AND gates $G_5$ to $G_8$ of a gate means 22 in the embodiment of the present invention consist of a CMOS NAND gate circuit 28 composed of the respective four MOS transistors and a CMOS inverter circuit 29 composed of two MOS transistors, so that the total six MOS transistors are needed.

Accordingly, though the number of transistor seems to be increased due to an addition of a gate means 22, the number of transistors of the whole ROM circuit is reduced according to an enlargement of capacitance.

In order to testify the above statement logically, a compaction of the required area is inspected as follows.

For example, assume that the number of a word line of a ROM circuit having the M-bit inputs and the N-bit outputs is $2^M = L$. The numer of transistors of an enconder in a ROM circuit of the prior static CMOS type become 2LN. Namely, it is assumed that the number of transistor of an AND circuit portion and an OR circuit portion is identical, and, though transistors in an OR circuit portion are not formed at all the cross sections, an area is identically laid out at the cross section in which transistors are not formed, so that the number of transistors is identical.

In case of the precharged AND ROM circuit of the present invention, the number of transistor of an encoder is $LN + 6L + N$. Here, an LN is the number of N-channel MOS transistors of a memory cell array or an OR circuit portion 24, a 6L is the number of MOS transistors of a gate means 22 and an N is the number of P-channel MOS transistors of a precharged means 26.

Accordingly, if the inequality equation according to the condition of $LN + 6L + N < 2LN$ is arranged, it becomes $6L + N < LN$, and here, provided that L approximately equals N, the condition of $L = 2 < 7$ can be obtained.

Consequently, in case that an M is above 3, namely, the input bit number is above 3 bit and the output bit number is above 8 bit, it can be known that the size of a precharged AND ROM circuit is smaller than that of the prior static CMOS ROM circuit.

Figure 4:
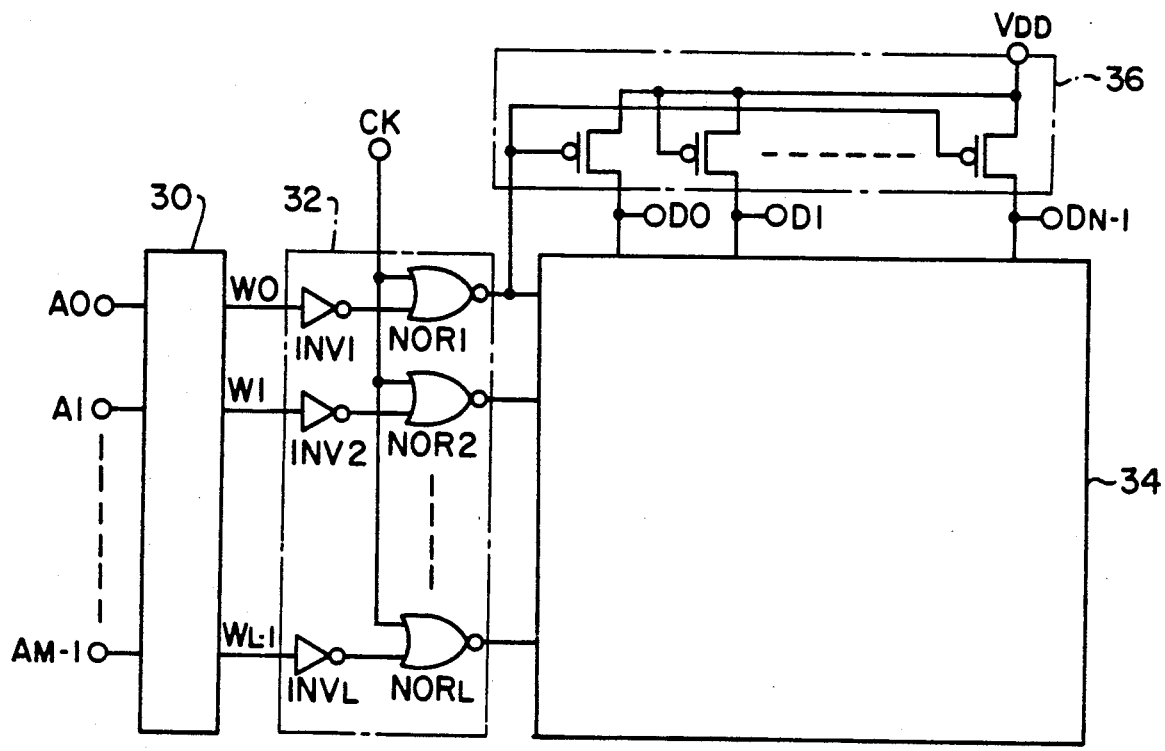
FIG. 4 is a circuit diagram of a N×N precharged NOR ROM showing another preferable embodiment of the present invention.

FIG. 4 is a circuit diagram of a precharged NOR ROM showing another embodiment of the present invention.

In FIG. 4, a ROM circuit consists of a gate means 32 substituting an AND gate of a gate means 22 of FIG. 2 for an inverter and an NOR gate in order to precharge at the "1" state of clock signal(CK) and operate normally at the "0" state.

Here, in order to supply the inverted clock signal (CK) with a precharged means 36, the output of an NOR gate (NOR1) of a gate means 32 is respectively supplied with a gate electrode of P-channel MOS transistors of a precharged means 36.

Therefore, a ROM circuit of FIG. 4 is precharged at the "1" state of a clock signal(CK) and operated normally at the "0" state. A degree of compaction is identical to a precharged AND ROM circuit as described above.

In the present invention as described above, by substituting an AND circuit portion of the P-channel MOS transistors in a CMOS ROM circuit for the P-channel MOS transistors of the output lines driven according to a clock signal and an NOR gate and an inverter of the word line number, the size of a ROM circuit having above 3×8 size can be reduced in proportion to a memory capacitance compared with a prior static CMOS ROM circuit.

The reduction of the required area of a ROM circuit within the exclusively used DSP chip used in a DAT, etc., can afford to enable a circuit having the diverse functions to be supplemented within the identical chip area, so that a high value added and a high dignity can be attempted.

What is claimed is:

1. A ROM circuit, having M address lines and N output lines, comprising:
   a decoder for generating $2^M$ bit word signals according to M bit address signals input on said M address lines;
   a gate means for selectively supplying said $2^M$ bit word signals to $2^M$ word lines according to a clock signal;
   a memory cell array for storing the desired data according to a combinational existence of MOS transistors at predetermined cross sections of said word lines and said output lines; and
   a precharged means for precharging said output lines according to said clock signal.

2. A ROM circuit as claimed in claim 1, wherein said precharged means comprises a switching device connected between a first voltage supply power source and said output lines which is turned on and off according to said clock signal.

3. A ROM circuit as claimed in claim 2, wherein said switching device comprises MOS transistors of a first conductive type and said MOS transistors of said memory cell array are of a second conductive type.

4. A ROM circuit as claimed in claim 3, wherein the MOS transistors of said first conductive type are P-channel MOS transistors and the MOS transistors of said second conductive type are N-channel MOS transistors.

5. A ROM circuit as claimed in claim 1, wherein said gate means comprises $2^M$ AND gates, each having a first input terminal coupled to receive said clock signal, a second input terminal coupled to receive a corresponding bit signal of the $2^M$ bit word signals output from said decoder, and an output terminal coupled to a corresponding one of said word lines.

6. A ROM circuit as claimed in claim 1, wherein said gate means comprises $2^M$ inverters for inverting corresponding bit signals of the $2^M$ bit word signals output from said decoder, and $2^M$ NOR gates, each of said NOR gates having a first input terminal coupled to receive said clock signal, a second input terminal coupled to receive an output of a corresponding one of said inverters, and an output terminal coupled to a corresponding one of said word lines.

7. A ROM circuit as claimed in claim 6, wherein said clock signal is supplied to said precharged means through any one of said NOR gates of said gates means.

8. A ROM circuit as claimed in claim 1, wherein said number M is more than three and said number N is more than eight.

9. A ROM circuit as claimed in claim 1, wherein said gate means supplies the output of said decoder to said word lines when said clock signal is at a logic state "1", and said precharged means precharges an output line when said clock signal is at a logic state "0".

10. A ROM circuit as claimed in claim 1, wherein said gate means supplies the output of said decoder to said word lines when said clock signal is at a logic state "0", and said precharged means precharges an output line when said clock signal is at a logic state "1".

* * * * *